United States Patent
Chan et al.

(10) Patent No.: US 8,049,230 B2
(45) Date of Patent: Nov. 1, 2011

(54) APPARATUS AND SYSTEM FOR MINIATURE SURFACE MOUNT DEVICES

(75) Inventors: Alex Chan, Hong Kong (CN); Xuan Wang, Guangdong (CN)

(73) Assignee: Cree Huizhou Opto Limited, Guangdong Province (CN)

( * ) Notice: Subject to any disclaimer, the term of this patent is extended or adjusted under 35 U.S.C. 154(b) by 126 days.

(21) Appl. No.: 12/152,766

(22) Filed: May 16, 2008

(65) Prior Publication Data

US 2009/0283781 A1   Nov. 19, 2009

(51) Int. Cl.
*H01L 33/00* (2010.01)
(52) U.S. Cl. ....... 257/89; 257/98; 257/99; 257/E33.057; 257/E33.01
(58) Field of Classification Search ............ 257/13, 257/79–103, 918, E51.018–E51.022, E33.001–E33.077, 257/E25.028, E25.032
See application file for complete search history.

(56) References Cited

U.S. PATENT DOCUMENTS

| | | | |
|---|---|---|---|
| 3,760,237 A | 9/1973 | Jaffe | 257/98 |
| 4,307,297 A | 12/1981 | Groff | |
| 4,511,425 A | 4/1985 | Boyd | 156/493 |
| 5,040,868 A | 8/1991 | Waitl | |
| 5,130,761 A | 7/1992 | Toshiaki | 357/17 |
| 5,167,556 A | 12/1992 | Stein | |
| 5,351,106 A * | 9/1994 | Lesko et al. | 355/83 |
| 5,703,401 A | 12/1997 | Van De Water | |
| 5,706,177 A | 1/1998 | Nather | |
| 5,790,298 A | 8/1998 | Tonar | 359/267 |

(Continued)

FOREIGN PATENT DOCUMENTS

CN    2498694    7/2002

(Continued)

OTHER PUBLICATIONS

Official Notice of Decision for Refusal regarding related Japanese Design Application No. 2009-002857, dated Nov. 17, 2009.

(Continued)

*Primary Examiner* — Fernando L Toledo
*Assistant Examiner* — Mamadou Diallo
(74) *Attorney, Agent, or Firm* — Koppel, Patrick, Heybl & Philpott (57) ABSTRACT

In one embodiment, a surface-mount device comprises a casing having opposed, first and second main surfaces, side surfaces, and end surfaces. A lead frame partially encased by the casing comprises (1) an electrically conductive LED chip carrier part having a surface carrying a linear array of LEDs adapted to be energized to produce in combination a substantially full range of colors, each LED having a first electrical terminal and a second electrical terminal, the first terminal of each of the LEDs being electrically and thermally coupled to the chip carrying surface of the chip carrier part; and (2) electrically conductive connection parts separate from the chip carrier part, each of the connection parts having a connection pad, the second terminal of each of the LEDs being electrically coupled to the connection pad of a corresponding one of the connection parts with a single wire bond. The linear array of LEDs extends in a first direction, and each of the chip carrier part and connection parts has a lead. The leads may be disposed in parallel relationship with each other and extend through the end surfaces of the casing in a second direction, the second direction being orthogonal to the first direction. An array of the surface-mount devices may be used in an LED display such as an indoor LED screen.

24 Claims, 6 Drawing Sheets

U.S. PATENT DOCUMENTS

| | | | |
|---|---|---|---|
| 5,813,753 A | 9/1998 | Vriens et al. | 362/293 |
| 5,907,151 A | 5/1999 | Gramann | |
| 5,959,316 A | 9/1999 | Lowery | 257/98 |
| 6,061,160 A * | 5/2000 | Maruyama | 359/152 |
| 6,066,861 A | 5/2000 | Hohn et al. | |
| 6,183,100 B1 | 2/2001 | Suckow et al. | 362/35 |
| 6,224,216 B1 | 5/2001 | Parker et al. | 353/31 |
| 6,259,608 B1 | 7/2001 | Berardinelli et al. | |
| 6,274,924 B1 | 8/2001 | Carey et al. | 257/676 |
| 6,296,367 B1 * | 10/2001 | Parsons et al. | 362/183 |
| 6,359,236 B1 | 3/2002 | DiStefano et al. | |
| 6,376,902 B1 * | 4/2002 | Arndt | 257/678 |
| 6,454,437 B1 | 9/2002 | Kelly | 362/246 |
| 6,469,321 B2 | 10/2002 | Arndt | |
| 6,480,389 B1 | 11/2002 | Shie et al. | 361/707 |
| 6,517,218 B2 | 2/2003 | Hochstein | 362/294 |
| 6,573,580 B2 | 6/2003 | Arndt | |
| 6,610,563 B1 | 8/2003 | Waitl | |
| 6,614,058 B2 * | 9/2003 | Lin et al. | |
| 6,624,491 B2 * | 9/2003 | Waitl et al. | |
| 6,680,490 B2 | 1/2004 | Yasukawa et al. | |
| 6,686,609 B1 | 2/2004 | Sung | |
| 6,707,069 B2 | 3/2004 | Song et al. | 257/79 |
| 6,710,373 B2 | 3/2004 | Wang | |
| 6,759,733 B2 | 7/2004 | Arndt | |
| 6,770,498 B2 * | 8/2004 | Hsu | 438/26 |
| 6,774,401 B2 | 8/2004 | Nakada et al. | |
| 6,791,259 B1 | 9/2004 | Stokes | |
| 6,858,879 B2 | 2/2005 | Waitl | |
| 6,872,585 B2 | 3/2005 | Matsumura et al. | |
| 6,876,149 B2 | 4/2005 | Miyashita | |
| 6,900,511 B2 | 5/2005 | Ruhnau et al. | |
| 6,911,678 B2 | 6/2005 | Fujisawa et al. | |
| 6,914,268 B2 | 7/2005 | Shei | 257/99 |
| 6,919,586 B2 | 7/2005 | Fujii | |
| 6,940,704 B2 | 9/2005 | Stalions | |
| 6,946,714 B2 | 9/2005 | Waitl | |
| 6,975,011 B2 | 12/2005 | Arndt | |
| 6,995,510 B2 | 2/2006 | Murakami et al. | |
| 7,021,797 B2 * | 4/2006 | Minano et al. | 362/355 |
| 7,064,907 B2 | 6/2006 | Kaneko | |
| 7,066,626 B2 | 6/2006 | Omata | |
| 7,102,213 B2 | 9/2006 | Sorg | |
| 7,119,422 B2 * | 10/2006 | Chin | 257/666 |
| 7,161,189 B2 | 1/2007 | Wu | 257/98 |
| 7,224,000 B2 * | 5/2007 | Aanegola et al. | 257/98 |
| 7,285,802 B2 | 10/2007 | Ouderkirk et al. | 257/98 |
| D572,210 S | 7/2008 | Lee | D13/180 |
| D572,670 S * | 7/2008 | Ono et al. | D13/180 |
| D576,574 S * | 9/2008 | Kobayakawa | D13/180 |
| 2002/0021085 A1 * | 2/2002 | Ng | |
| 2002/0061174 A1 | 5/2002 | Hurt et al. | |
| 2002/0123163 A1 | 9/2002 | Fujii | |
| 2002/0163001 A1 | 11/2002 | Shaddock | |
| 2002/0171911 A1 * | 11/2002 | Maegawa | |
| 2002/0195935 A1 | 12/2002 | Jager | |
| 2003/0116769 A1 | 6/2003 | Song et al. | |
| 2003/0183852 A1 * | 10/2003 | Takenaka | |
| 2004/0041222 A1 | 3/2004 | Loh | |
| 2004/0047151 A1 | 3/2004 | Bogner et al. | |
| 2004/0079957 A1 | 4/2004 | Andrews et al. | |
| 2004/0080939 A1 | 4/2004 | Braddell et al. | |
| 2004/0126913 A1 | 7/2004 | Loh | |
| 2004/0217364 A1 | 11/2004 | Tarsa | |
| 2004/0227149 A1 | 11/2004 | Ibbetson | |
| 2004/0232435 A1 | 11/2004 | Hofer | |
| 2004/0238930 A1 | 12/2004 | Arndt | |
| 2005/0023548 A1 | 2/2005 | Bhat | |
| 2005/0072981 A1 | 4/2005 | Suenaga | |
| 2005/0077535 A1 * | 4/2005 | Li | |
| 2005/0093005 A1 | 5/2005 | Ruhnau | |
| 2005/0117320 A1 | 6/2005 | Leu et al. | |
| 2005/0127377 A1 | 6/2005 | Arndt | |
| 2005/0135105 A1 * | 6/2005 | Teixeira et al. | |
| 2005/0152127 A1 * | 7/2005 | Kamiya et al. | |
| 2005/0179376 A1 | 8/2005 | Fung et al. | |
| 2006/0022212 A1 | 2/2006 | Waitl | |
| 2006/0049477 A1 | 3/2006 | Arndt | |
| 2006/0102917 A1 | 5/2006 | Oyama et al. | |
| 2006/0108594 A1 | 5/2006 | Iwasaki et al. | |
| 2006/0133044 A1 * | 6/2006 | Kim et al. | |
| 2006/0157828 A1 | 7/2006 | Sorg | |
| 2006/0220046 A1 * | 10/2006 | Yu et al. | |
| 2007/0046176 A1 * | 3/2007 | Bukesov et al. | |
| 2007/0109779 A1 * | 5/2007 | Sekiguchi et al. | |
| 2007/0170449 A1 * | 7/2007 | Anandan | 257/98 |
| 2007/0269586 A1 | 11/2007 | Leatherdale | |
| 2008/0013319 A1 * | 1/2008 | Pei et al. | |
| 2008/0074032 A1 * | 3/2008 | Yano et al. | |
| 2008/0121921 A1 * | 5/2008 | Loh et al. | 257/99 |
| 2008/0186702 A1 * | 8/2008 | Camras et al. | |
| 2008/0191232 A1 * | 8/2008 | Lee et al. | |
| 2008/0303052 A1 * | 12/2008 | Lee et al. | |
| 2008/0308825 A1 | 12/2008 | Chakraborty | |
| 2009/0050908 A1 * | 2/2009 | Yuan et al. | |
| 2009/0050911 A1 | 2/2009 | Chakraborty | |
| 2009/0057699 A1 | 3/2009 | Basin | |
| 2009/0072251 A1 * | 3/2009 | Chan et al. | |
| 2009/0129085 A1 * | 5/2009 | Aizar et al. | 362/247 |
| 2009/0189178 A1 * | 7/2009 | Kim et al. | |
| 2009/0283781 A1 * | 11/2009 | Chan et al. | |

FOREIGN PATENT DOCUMENTS

| | | | |
|---|---|---|---|
| CN | 2646873 | | 10/2004 |
| CN | 1581527 A | | 2/2005 |
| CN | 1591924 A | * | 3/2005 |
| CN | 1679168 A | * | 10/2005 |
| CN | 1744335 A | | 3/2006 |
| CN | 1801498 A | | 7/2006 |
| CN | 101061590 A | | 10/2007 |
| EP | 1005085 A2 | | 5/2000 |
| EP | 1187226 A1 | | 3/2002 |
| EP | 1187227 | | 3/2002 |
| EP | 1187228 | | 3/2002 |
| EP | 1521313 | | 4/2005 |
| GB | 2420221 A | | 12/2004 |
| GB | 2420221 A | | 5/2006 |
| JP | 03-171780 | | 7/1991 |
| JP | 06-177424 | | 6/1994 |
| JP | 8139257 | | 5/1996 |
| JP | 11-167805 A | | 6/1999 |
| JP | 2000223752 | | 8/2000 |
| JP | 2006-324331 | | 11/2006 |
| JP | 2007-273763 | | 10/2007 |
| JP | 2007-287981 | | 11/2007 |
| JP | 2007-299905 | | 11/2007 |
| WO | WO 9931737 | | 6/1999 |
| WO | WO 0217405 | | 2/2002 |
| WO | WO 2004027882 | | 4/2004 |
| WO | WO 2004044877 | | 5/2004 |
| WO | WO 2005043627 A1 | | 5/2005 |
| WO | WO 2005104247 | * | 11/2005 |
| WO | WO 2006054228 A2 | * | 5/2006 |
| WO | WO 2006054228 A3 | * | 5/2006 |
| WO | WO 2007/083408 A1 | | 7/2007 |
| WO | WO 2009/074919 A1 | | 6/2009 |

OTHER PUBLICATIONS

JP 2001 060072A , Abstract, Matsushita Electric IND. CO LTD., Mar. 6, 222001.

Nichia Corp. White LED Part No. NSPW300BS, Specification for Nichia White LED , Model NSPW300BS., Jan. 14, 2004.

Nicha Corp., White LED Part No. NSPW312BS, Specification for Nichia White LED, Model NSPW312BS. Jan. 14, 2004.

Kim J.K at al. "Strongly Enhanced Phosphor Efficiency in GaInN White Light-Emitting Diodes Using Remote Phosphor Configuration and Diffuse Reflector Cup" Japanese Journal of Applied Physics, Japan Society of Applied Physics, Tokyo, JP, vol. 44, No. 20-23, Jan. 1, 2005 XP-001236966, pp. 649-651.

Preliminary Notice of Reasons for Refusal re related Japanese Application No. 2009-002857, dated: Apr. 24, 2009, pp. 1-2.

Preliminary Notice of Reasons for Refusal re related Japanese Application No. 2009-002857, dated: Jul. 24, 2009.

Office Action from related China Application No. 200710142310.7, dated: Dec. 11, 2009.

Declaration of Gerald Kegley under 37 C.F.R. § 1.132, dated: Aug. 20, 2009.
Declaration of Charles Swoboda under 37 C.F.R. § 1.132, dated: Aug. 19, 2009.
First Office Action for Chinese Patent Application No. 200780019643.9 dated Mar. 29, 2010.
International Search Report for PCT/CN2009/074800 mailed Feb. 25, 2010.
Office Action from U.S. Appl. No. 11/149,998, dated: Nov. 20, 2009.
Response to Office Action from U.S. Appl. No. 11/149,998, dated: Feb. 22, 2010.
Office Action from U.S. Appl. No. 12/154,691, dated: Dec. 17, 2009.
Response to Office Action from U.S. Appl. No. 12/154,691, dated: May 17, 2010.
Office Action from U.S. Appl. No. 11/465,120, dated: Mar. 9, 2010.
Office Action from U.S. Appl. No. 12/069,827, dated: Apr. 20, 2010.
Office Action from U.S. Appl. No. 12/321,059, dated: May 17, 2010.
Office Action from U.S. Appl. No. 11/149,998, dated: May 18, 2010.
Appeal Decision in Japanese Design Patent Application No. 2009-002857 (Appeal No. 2010-002154) mailed Aug. 20, 2010.
Notification of First Office Action in counterpart application CN 200880009255.7 mailed Sep. 26, 2010.
International Search Report and Written Opinion from PCT/CN2010/001009 mailed Oct. 21, 2010.
International Search Report and Written Opinion from PCT/US2010/001852 mailed Nov. 11, 2010.
Office Action in related U.S. Appl. No. 12/002,410, dated: Apr. 26, 2011.
Office Action in related U.S. Appl. No. 12/002,410, dated: May 25, 2010.
Office Action in related U.S. Appl. No. 12/002,410, dated: Dec. 13, 2010.
Office Action in related U.S. Appl. No. 11/149,998, dated: May 11, 2011.
Office Action in related U.S. Appl. No. 11/149,998, dated: Aug. 27, 2010.
Office Action in related U.S. Appl. No. 11/149,998, dated: Jan. 24, 2011.
Office Action in related U.S. Appl. No. 11/149,998, dated: Nov. 20, 2009.
Response to OA in related U.S. Appl. No. 11/149,998, dated: Nov. 20, 2009, Response filed: Feb. 22, 2010.
Office Action in related U.S. Appl. No. 11/149,998, dated: May 18, 2010.
Office Action in related U.S. Appl. No. 12/291,293, dated: May 27, 2010.
Office Action in related U.S. Appl. No. 12/291,293, dated: Sep. 3, 2010.
Office Action in related U.S. Appl. No. 12/291,293, dated: Mar. 1, 2011.
Office Action in related U.S. Appl. No. 11/496,922, dated: Jun. 10, 2010.
Office Action in related U.S. Appl. No. 11/496,922, dated: Dec. 15, 2010.
Office Action in related U.S. Appl. No. 11/465,120, dated: Sep. 8, 2010.
Office Action in related U.S. Appl. No. 11/465,120, dated: Dec. 13, 2010.
Office Action in related U.S. Appl. No. 11/465,120, dated: Mar. 9, 2010.
Office Action in related U.S. Appl. No. 12/635,818, dated: Oct. 14, 2010.
Office Action in related U.S. Appl. No. 12/695,978, dated: Dec. 20, 2010.
Office Action in related U.S. Appl. No. 12/695,978, dated: May 10, 2011.
Office Action in related U.S. Appl. No. 12/069,827, dated: Oct. 20, 2010.
Office Action in related U.S. Appl. No. 12/069,827, dated: Apr. 20, 2010.
Office Action in related U.S. Appl. No. 12/069,827, dated: Jan. 27, 2011.
Office Action in related U.S. Appl. No. 12/154,691, dated: Dec. 17, 2009.
Response to OA in related U.S. Appl. No. 12/154,691, dated: Dec. 17, 2009, Response filed: May 17, 2010.
Office Action in related U.S. Appl. No. 12/321,059, dated: May 17, 2010.
CREE® XLAMP® MC-E LEDS Product Info Sheets, pp. 1-3.
Nichia Corporation LEDS, Models NSSM016G, NSSM227, NESM026X, NSSM026BB, NESM005A, 9 Pages.

* cited by examiner

FIG. 18

APPARATUS AND SYSTEM FOR MINIATURE SURFACE MOUNT DEVICES

The present invention relates generally to electronic packaging, and more particularly to surface mount devices (SMDs) for use in LED displays.

BACKGROUND OF THE INVENTION

Field of the Invention

In recent years, there have been dramatic improvements in light emitting diode (LED) technology such that LEDs of increased brightness and color fidelity have been introduced. Due to these improved LEDs and improved image processing technology, large format, full color LED video screens have become available and are now in common use. Large format LED displays typically comprise a combination of individual LED panels providing image resolutions determined by the distance between adjacent pixels or "pixel pitch".

Outdoor displays, which are intended for viewing from greater distances, have relatively large pixel pitches and usually comprise discrete LED arrays. In the discrete LED arrays, a cluster of individually mounted red, green, and blue LEDs are driven to form what appears to the viewer as a full color pixel. On the other hand, indoor screens, which require shorter pixel pitches such as 3 mm or less, typically comprise panels carrying red, green, and blue LEDs mounted on single SMD chipsets, with each chipset defining a pixel. The relatively small SMDs are attached to a driver printed circuit board (PCB).

Although both indoor and outdoor displays are viewable across a substantial range of off-axis angles, such as up to 145° or even greater, there is often a perceptible loss of color fidelity with increasing viewing angle. Additionally, the material of each LED package and/or the material used to mount each of the LEDs may have reflective characteristics, which can further decrease color fidelity by creating unwanted light reflection and/or glare.

Also, it is well known in the art that SMDs and many other types of electronic packages, whether containing integrated circuits or discrete components such as diodes or power transistors, dissipate sufficient heat to require thermal management. The objective of thermal management in the design of electronic packaging is to maintain the operating temperature of the active circuit or junction side of the component so it is low enough (for example, 110° C. or below) to prevent premature component failure. Various cooling strategies including conduction heat transfer are in common use. One conventional way of implementing conduction heat transfer for dissipating heat in an electronic package is to allow the heat to conduct away along the leads of the device. However, the leads often do not have sufficient mass or exposed surface area to provide effective heat dissipation. For example, high intensity LEDs that emit light principally in the visible part of the electromagnetic spectrum can generate significant amounts of heat that is difficult to dissipate using such conventional techniques.

SUMMARY OF THE INVENTION

The present invention provides systems and apparatuses for surface mount devices which allow for increased color fidelity and heat dissipation while decreasing unwanted light reflection and glare. One embodiment comprises a lead frame for a surface-mount device, the lead frame comprising an electrically conductive LED chip carrier part having a surface carrying a linear array of LEDs adapted to be energized to produce in combination a substantially full range of colors. Each LED has a first electrical terminal and a second electrical terminal, the first terminal of each of the LEDs being electrically and thermally coupled to the chip carrying surface of the chip carrier part. The lead frame further comprises electrically conductive connection parts separate from the chip carrier part, each of the connection parts having a connection pad. The second terminal of each of the three LEDs is electrically coupled to the connection pad of a corresponding one of the connection parts. The lead frame further comprises a black casing that at least partially encases the lead frame.

Pursuant to another specific, exemplary embodiment, there is provided a surface-mount device, comprising a casing having opposed, first and second main surfaces, opposed side surfaces, and opposed end surfaces, the casing defining a cavity extending into the interior of the casing from the first main surface. The device further comprises a lead frame partially encased by the casing, the lead frame comprising (1) an electrically conductive LED chip carrier part having a surface carrying a linear array of LEDs adapted to be energized to produce in combination a substantially full range of colors, each LED having a first electrical terminal and a second electrical terminal, the first terminal of each of the LEDs being electrically and thermally coupled to the chip carrying surface of the chip carrier part; and (2) electrically conductive connection parts separate from the chip carrier part, each of the connection parts having a connection pad, the second terminal of each of the LEDs being electrically coupled to the connection pad of a corresponding one of the connection parts.

In accordance with yet another specific, exemplary embodiment, there is provided an LED display comprising a substrate carrying an array of surface-mount devices arranged in vertical columns and horizontal rows, each of the SMDs comprising a dark casing and containing a vertically oriented, linear arrangement of LEDs adapted to be energized to produce in combination a substantially full range of colors and to define one pixel of the display. Signal processing and LED drive circuitry is electrically connected to selectively energize the array of SMDs for producing visual images on the display. The linear orientation of the LEDs has been found to improve color fidelity over a wide range of viewing angles.

These and other further features and advantages of the invention would be apparent to those skilled in the art from the following detailed description, taken together with the accompanying drawings, in which:

BRIEF DESCRIPTION OF THE DRAWINGS

FIG. 14 is a front side view of the embodiment shown in FIG. 12, with the back side and left and right side views being substantially similar;

DETAILED DESCRIPTION OF THE INVENTION

The following description presents preferred embodiments of the invention representing the best mode contemplated for practicing the invention. This description is not to be taken in a limiting sense but is made merely for the purpose of describing the general principles of the invention, the scope of which is defined by the appended claims.

FIGS. 1-8 depict a surface-mount device (SMD) 10 and parts thereof according to specific, exemplary embodiments for use in LED displays such as indoor and/or outdoor LED screens. The SMD 10 includes a casing 12 carrying a lead frame 14 comprising a plurality of electrically conductive connection parts, which in this example comprise four parts 16, 18, 20, 22 (best shown in FIG. 6).

Figure 1:
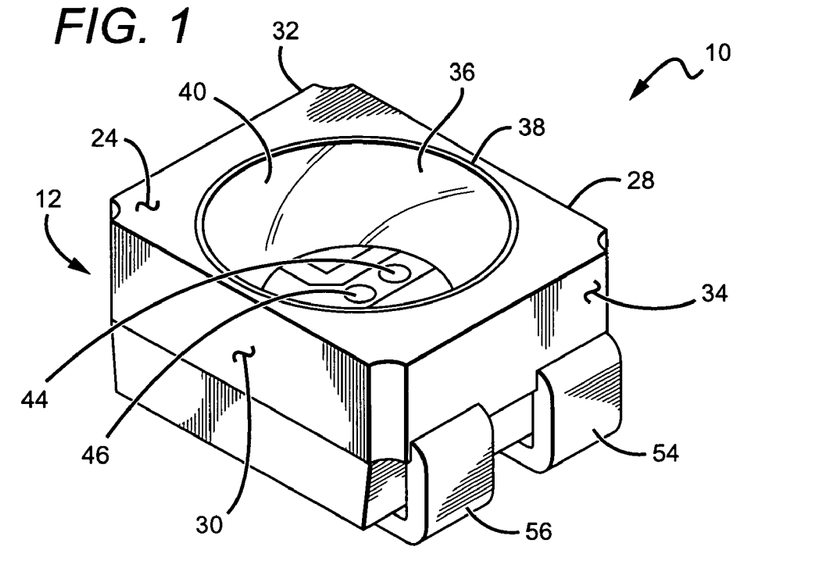
FIG. 1 is a perspective view of a surface mount device according to the present invention.

The casing 12 may be generally rectangular, comprising opposed, parallel upper and lower surfaces 24 and 26, respectively, side surfaces 28 and 30 and end surfaces 32 and 34. The corners of the casing may be rounded to act as through-holes as best described below in conjunction with FIG. 18.

Figure 12:
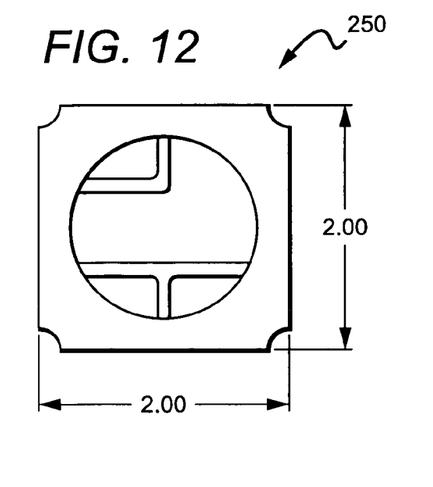
FIG. 12 is a top view of one embodiment of a surface mount device according to the present invention.
Figure 13:
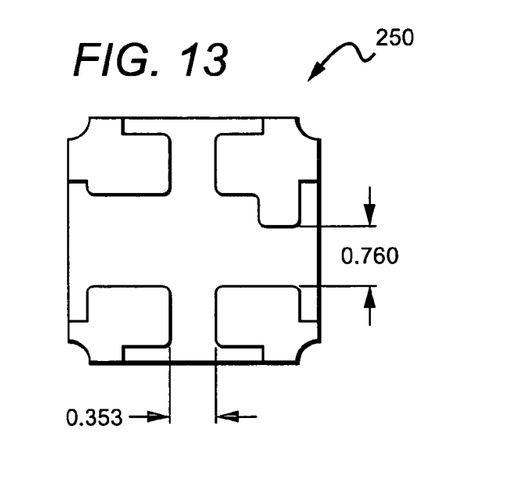
FIG. 13 is a bottom view of the embodiment shown in FIG. 12.
Figure 14:
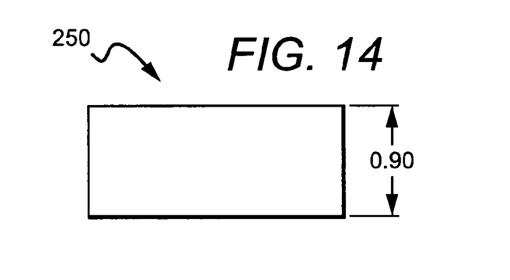
Figure 15:
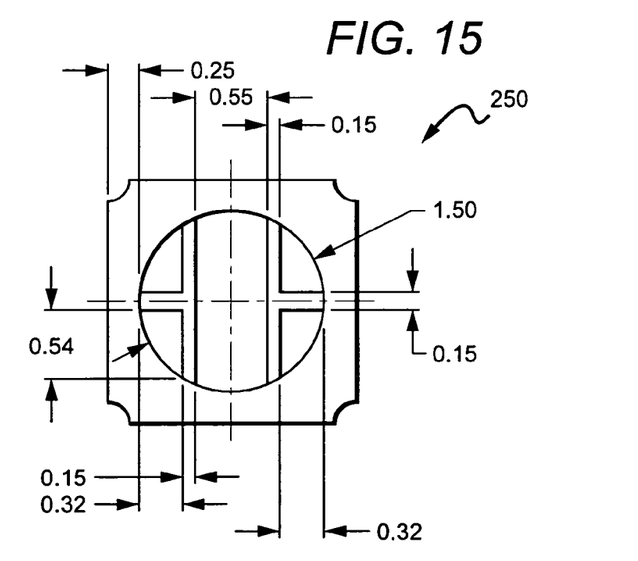
FIG. 15 is a top dimensional view of one embodiment of a surface mount device according to the present invention.
Figure 16:
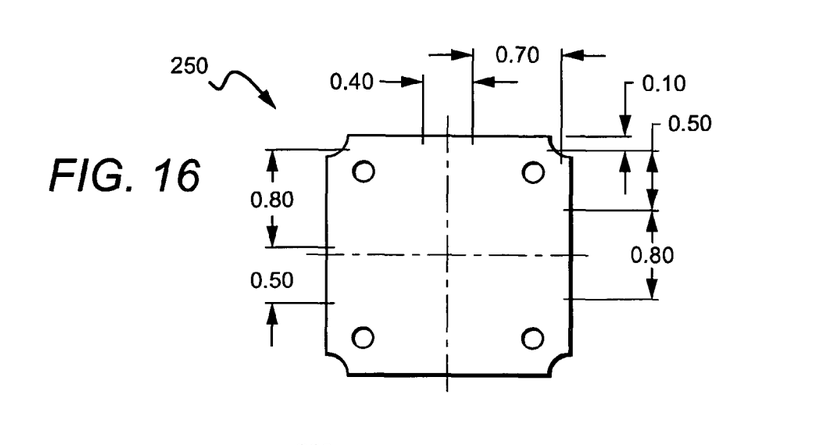
FIG. 16 is a bottom dimensional view of the embodiment shown in FIG. 15.
Figure 17:
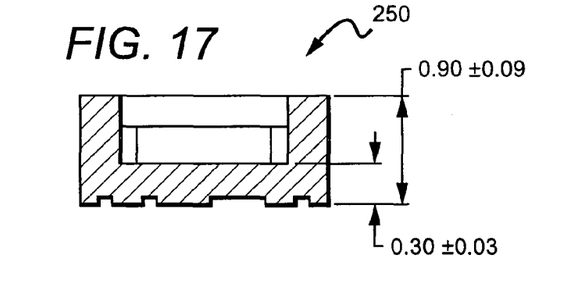
FIG. 17 is a right side dimensional view of the embodiment shown in FIG. 15.

By way of example and not limitation, and as best shown in FIGS. 12-14, the SMD 10 may have an overall length of ~2.0 mm, an overall width of ~2.0 mm, and a height of 0.90 mm.

Figure 3:
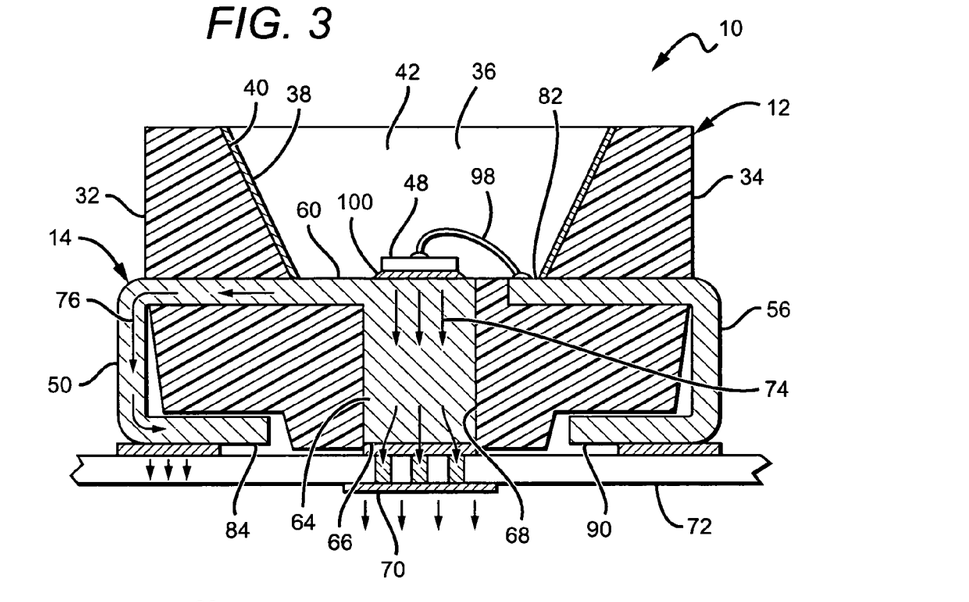
FIG. 3 is a cross section view of the embodiment of FIG. 1 as seen along the line 3-3 in FIG. 2.

The casing further defines a recess or cavity 36 extending from the upper surface 24 into the body of the casing 12. In some embodiments, a reflective insert or ring 38 may be positioned and secured along at least a portion of a side or wall 40 of the cavity 36, the effectiveness of the reflectivity of the ring 38 preferably being enhanced by tapering the cavity 36 and ring 38 carried therein inwardly toward the interior of the casing.

In some embodiments, the cavity 36 may be at least partially filled with a fill material 42. The fill material 42 can protect and positionally stabilize the lead frame 14 and the LEDs carried thereby. In some instances, the fill material 42 may cover the LEDs, the portions of the lead frame connection parts 16, 18, 20, 22 exposed through the cavity 36, and the LEDs' electrical connections. The fill material 42 may be selected to have predetermined optical properties so as to enhance the projection of light from the LEDs. The fill material 42 may be formed from a resin, an epoxy, a thermoplastic polycondensate, glass, and/or other suitable materials or combinations of materials. In some embodiments, materials may be added to the fill material to enhance the emission, absorption and/or dispersion of light to and/or from the LEDs.

The casing 12 may be fabricated of material that is preferably both electrically insulating and thermally conductive. Such materials are well-known in the art and may include, without limitation, certain ceramics, resins, epoxies, thermoplastic polycondensates (e.g., a polyphthalamide (PPA)), and glass. In a preferred embodiment, the casing 12 may be formed of black ceramic material (s). It has been found that the use of black material in image generation SMD packages, such as with SMDs employed in video displays, improves contrast.

Figure 2:
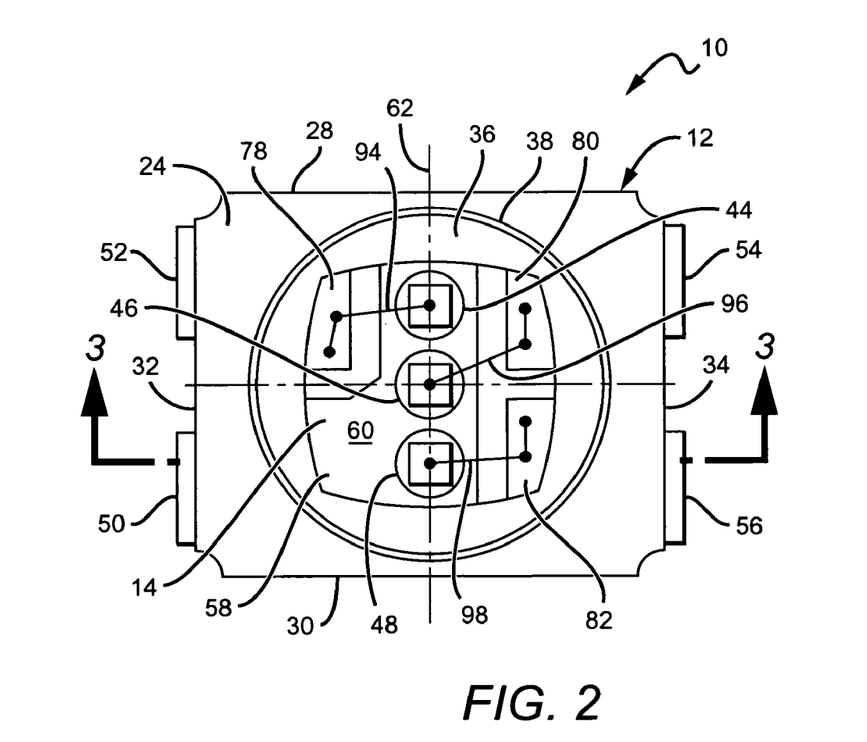
FIG. 2 is a top plan view of the embodiment shown in FIG. 1.

In the illustrative embodiment depicted, the SMD 10 houses three LEDs 44, 46, 48 preferably emitting red, green and blue colors, respectively, so that when appropriately energized the LEDs produce in combination a substantially full range of colors.

Figure 6:
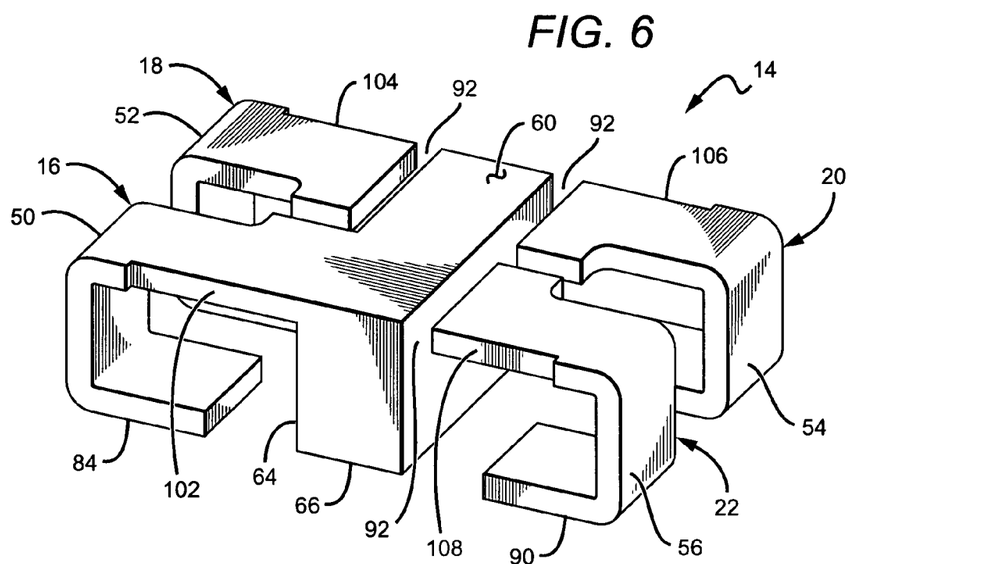
FIG. 6 is a perspective view of a lead frame in accordance with one embodiment that may be used in the device of FIG. 1.

In the illustrative embodiment shown, the lead frame parts 16, 18, 20, 22 include leads 50, 52, 54, 56, respectively, projecting outwardly through the opposed end surfaces 32 and 34 of the casing 12 from a central region 58 thereof.

Figure 7:
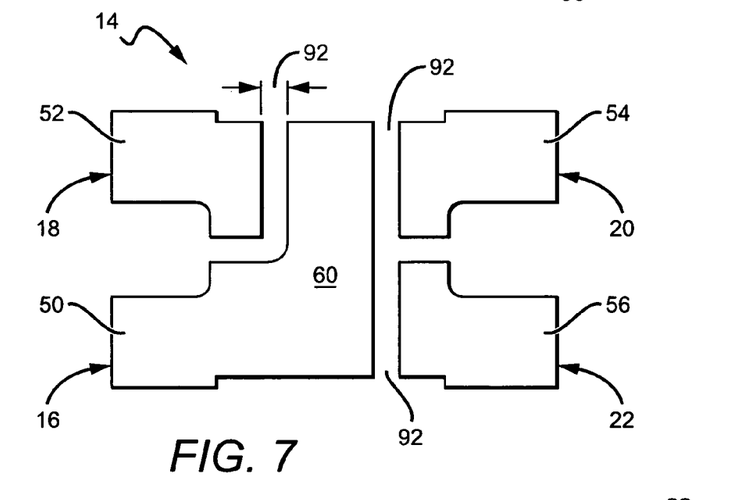
FIG. 7 is a top view of the lead frame shown in FIG. 6.
Figure 8:
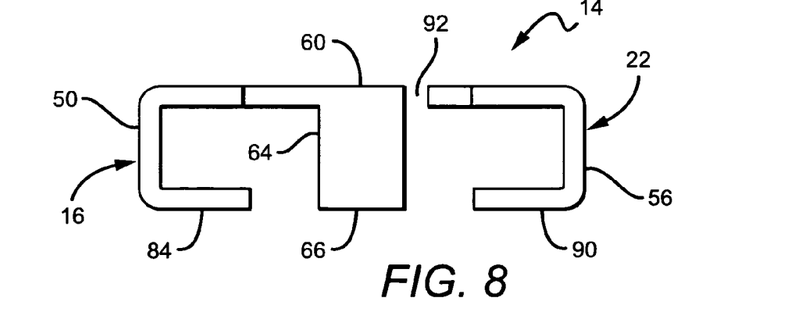
FIG. 8 is a side elevation view of the lead frame shown in FIG. 6.

The connection part 16 comprises a chip carrier part having an enlarged, central surface or pad 60 for carrying the LED chips 44, 46, 48 in a linear array that extends in a transverse direction 62, that is, in a direction perpendicular to the side surfaces 28 and 30. The leads 50, 52, 54, 56 are parallel to each other and extend in a direction perpendicular to the direction 62 of the linear LED array. The width of the leads may be quite small such that when an SMD 10 is viewed from the top, they are barely visible or completely invisible. Additionally and/or alternatively, the leads may be obstructed from view from the top by the casing 12. The pad 60 comprises the top surface of a thermally conductive body 64, in the form of, for example, a rectangular block extending vertically through the casing 12 to a bottom surface 66 of the body 64 exposed through an aperture 68 in the lower surface 26 of the casing 12 and disposed substantially flush with the lower surface 26.

The bottom surface 66 of the body of the connection part 60 is adapted to be disposed in heat transfer relationship with a heat spreader or dissipator 70 carried by a substrate 72 such as printed wiring or a circuit board. It will be seen that the thermally conductive body 64, given its relatively substantial mass and cross section area normal to the direction of heat flow, serves as an efficient heat sink providing a low thermal resistance path (arrows 74) between the heat-generating LEDs 44, 46, 48 carried by the pad 60 and the heat spreader 70. Some heat is also dissipated along the lead 50 (arrow 76).

The remaining connection parts 18, 20, 22 include enlarged electrical connection pads 78, 80, 82, respectively, positioned in the central region 58 adjacent to, but spaced apart from, the component-carrying surface 60 of the connection part 16. In a preferred form of the SMD 10, the leads 50, 52, 54, 56 are bent orthogonally to extend outside of and along their respective end surfaces 32 and 34 of the casing, then bent orthogonally again so that end portions 84, 86, 88, 90 of the leads extend along the lower surface 26 of the casing 12. The outwardly facing surfaces of the end portions 84, 86, 88, 90 of the leads and the bottom surface 66 of the thermal conductive body 64 are substantially flush to facilitate connection to the underlying substrate 72. The end portions 84, 86, 88, 90 of the leads are electrically connected or bonded to traces or pads on the substrate 72 using any of a number of well-known connection techniques, including soldering. In a preferred embodiment, solder pads are included on the bottom of the end portions such that no solder can be visible when viewing each individual SMD from the top. This is advantageous as it helps to prevent glare and improve contrast, particularly during daylight viewing. As best seen in FIGS. 1-3, the cavity 36 extends into the casing interior a sufficient depth to expose the connection part pads 60 and 78, 80, 82.

Figure 4:
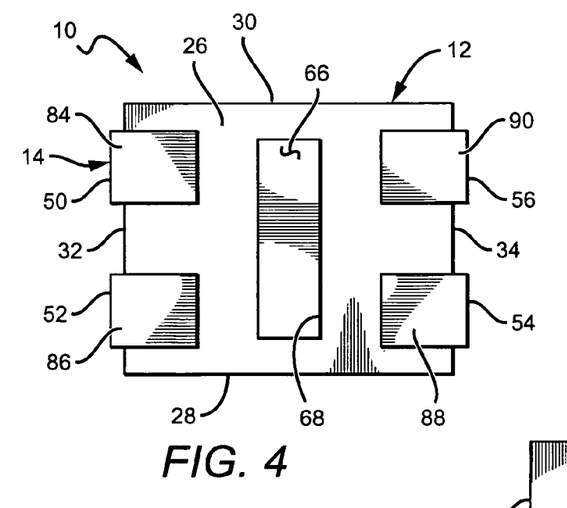
FIG. 4 is a bottom view of the embodiment shown in FIG. 1.
Figure 5:
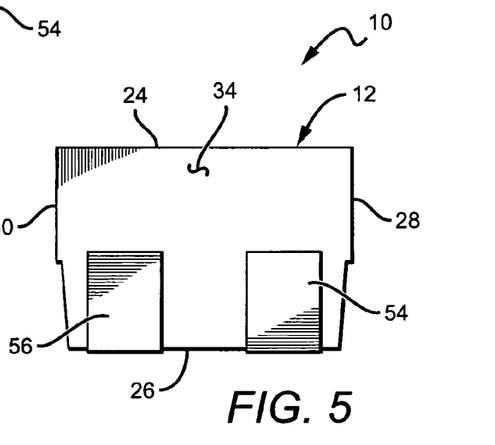
FIG. 5 is an end elevation view of the embodiment shown in FIG. 1.

The dimensions of the end portions 84, 86, 88, 90 of the leads 50, 52, 54, 56 that extend inwardly from the end surfaces 32 and 34 of the casing may depend on the intended implementation of the SMD, the LEDs to be utilized, the material of the casing 12, the size of the SMD and/or other such factors and/or combinations of factors. In some implementations, each of the leads 50, 52, 54, 56 exterior of the casing may be separated by gaps 92 between pads to electrically isolate the connection parts from each other.

The connector parts 16, 18, 20, 22 may be made from an electrically conductive metal or metal alloy, such as copper, a copper alloy, and/or other suitable low resistivity, corrosion resistant materials or combinations of materials. As noted, the thermal conductivity of the lead 50 of the connector part 16 may assist, to some extent, in conducting heat away from the LEDs 44, 46, 48 carried by the SMD as shown by the arrow 76.

Each of the LEDs 44, 46, 48 has a pair of electrical terminals or electrodes, identified as a cathode and an anode as is well known. In accordance with a typical implementation of the embodiments shown, the cathodes of the LEDs 44, 46, 48 are coupled to the central pad 60 while the anodes of the LEDs are coupled, respectively, to the pads 78, 80, 82 of the separate connector parts by single wire bonds 94, 96, 98.

Each of the LEDs 44, 46, 48 may be electrically coupled with the pad 60 by means of an electrically and thermally conductive interface 100 such as a solder, adhesive, coating, film, encapsulant, paste, grease and/or other suitable material. In a preferred embodiment, the LEDs may be electrically coupled and secured to the pad 60 using a solder pad on the bottom of the LEDs such that the solder is not visible from the top. Preventing the solder from being seen from the top is advantageous so as to reduce reflection and provide better contrast, particularly during the day time.

In other embodiments, one or more of the leads 50, 52, 54, 56 may further include one or more indentations, through-holes or apertures, extensions, and/or other features that contribute to the stability, integrity and/or robustness of the SMD package. For example, the leads 50, 52, 54, 56 may include indentations 102, 104, 106, 108, respectively, that extend generally along the outside edges of the leads. The indentations and/or other such features of the leads cooperate with the casing and/or fill material, at least in part, to enhance the structural stability and integrity of the SMD package. In some implementations, the casing material and/or fill material extends at least partially around, into and/or through one or more of the gaps 92, and areas exposed by the indentations 102, 104, 106, 108 formed in the leads.

The SMD 10 may be formed and/or assembled through any one of a variety of known methods. For example, the casing 12 may be formed or molded around the connection parts 16, 18, 20, 22. Alternatively, the casing may be molded in sections, for example, top and bottom sections which are subsequently joined by an epoxy, adhesive or other suitable joinder material.

In some methods of manufacturing, the LEDs may be coupled to the pad 60 prior to molding and/or assembling the casing 12 about the connection pads. Alternatively, the LEDs may be coupled to the pad 60 after the connector parts have been partially encased within the casing. The cavity 36 that extends into the casing may be configured so that sufficient portions of the pads 60 and 78, 80, 82 are exposed to receive the LEDs and the associated wire bonds.

The fabrication of the connector parts 16, 18, 20, 22 may be accomplished by stamping, injection molding, cutting, etching, bending or through other known methods and/or combinations of methods to achieve the desired configurations. For example, the connector parts can be partially metal stamped (e.g., stamped simultaneously from a single sheet of relevant material), appropriately bent, and finally fully separated or fully separated following the formation of some or all of the casing.

Figure 9:
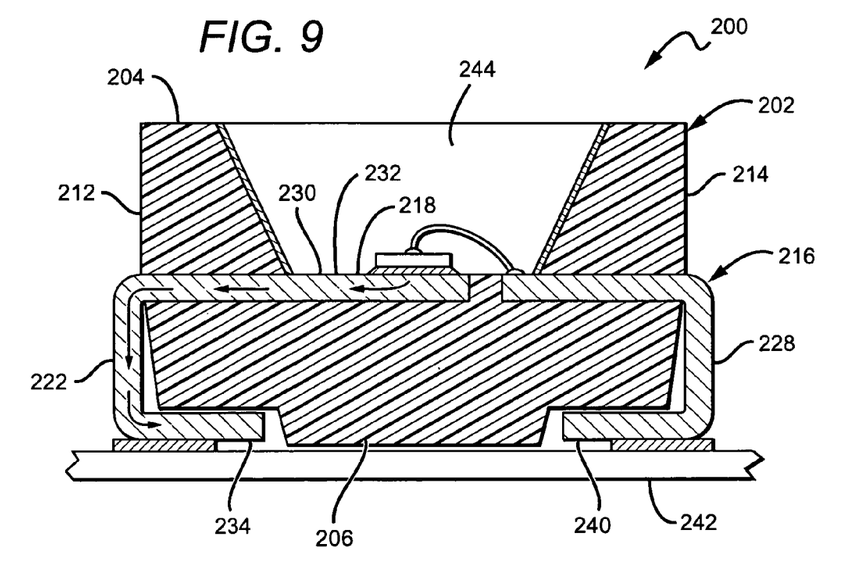
FIG. 9 is a cross section view, along the lines of that shown in FIG. 3, of another embodiment of a surface mount device according to the present invention.
Figure 10:
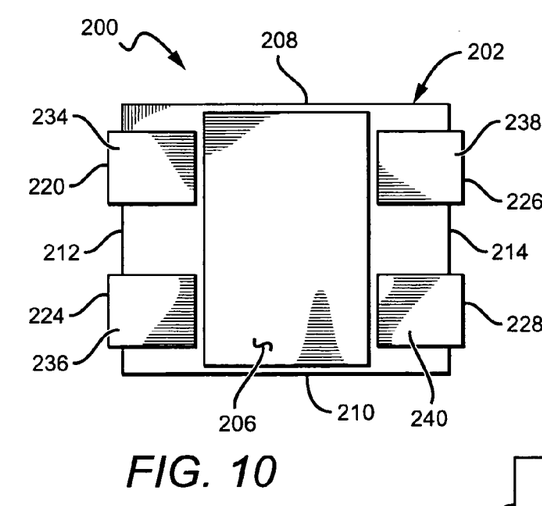
FIG. 10 is a bottom view of the embodiment shown in FIG. 9.
Figure 11:
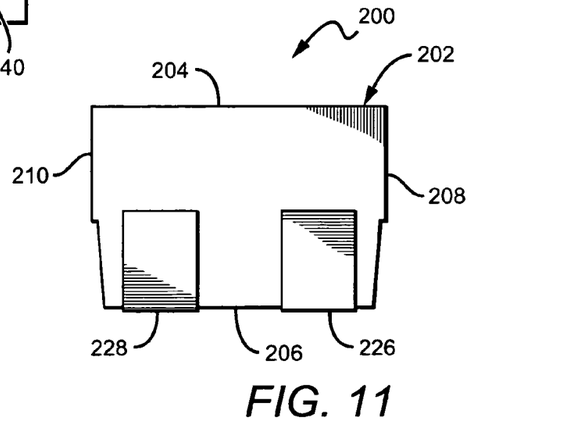
FIG. 11 is an end elevation view of the embodiment shown in FIG. 9.

FIGS. 9-11 show a surface-mount device 200 according to another specific, exemplary embodiment for use, by way of example, in an LED display screen. The SMD 200 of FIGS. 9-11 is identical in all respects to the embodiment shown in FIGS. 1-8 except that the thermally conductive body 64 has been omitted. Accordingly, the SMD of FIGS. 9-11 comprises a preferably black ceramic casing 202 comprising opposed upper and lower surfaces 204, 206, side surfaces 208, 210 and end surfaces 212, 214. The SMD 200 carries a lead frame 216 comprising, as before, four electrical connection parts that include a chip carrier part 218 and three separate connection parts (including the part 220) and leads 222, 224, 226, 228, respectively, projecting outwardly through the opposed end surfaces 212, 214 of the casing from a central region 230 thereof. The chip carrier part 218 has an enlarged, central surface or pad 232 for receiving LED chips, typically comprising red, green and blue LEDs. As before, the remaining connection parts include enlarged wire bond pads positioned in the central region adjacent to, but spaced apart from, the chip carrier part 218.

As before, the leads 222, 224, 226, 228 are bent orthogonally to extend along and outside of their respective casing end surfaces, then bent orthogonally again so that end portions 234, 236, 238, 240 of the leads 222, 224, 226, 228 extend along the bottom surface 206 of the casing. The outwardly facing surfaces of the end portions 234, 236, 238, 240 of the leads are electrically connected or bonded to traces or pads on a substrate 242, typically a printed circuit board, using any of a number of well known connection techniques. As before, the casing has a cavity 244 that extends a sufficient depth to expose the pads of the connection parts. The connection parts are preferably made from an electrically conductive sheet metal or sheet metal alloy cut from sheet metal stock by means of punch press operations and then bent into their final configuration either before or after the formation of the casing about the lead frame.

Each of the LEDs has a pair of electrical terminals or electrodes, the cathodes of which are electrically coupled to the central pad 232 while the anodes of the LEDs are coupled, respectively, to the pads of the separate connection parts by single wire bonds.

With reference now to FIGS. 12-17, some examples of dimensional characteristics of the various components of an SMD 250 are shown. By way of example and not by limitation, the dimensions depicted in FIGS. 12-17 may also apply to the common features of SMD 10 or 200. It is noted that the lead structure of SMD 250 is arranged slightly differently than the lead structure of SMDs 10 or 200. However, the differing configuration depicts another possible embodiment without affecting the functionality of the present invention. FIG. 13 depicts thermal pads 252 that can aid in thermal management such as dissipating heat away from any mounted device.

Figure 18:
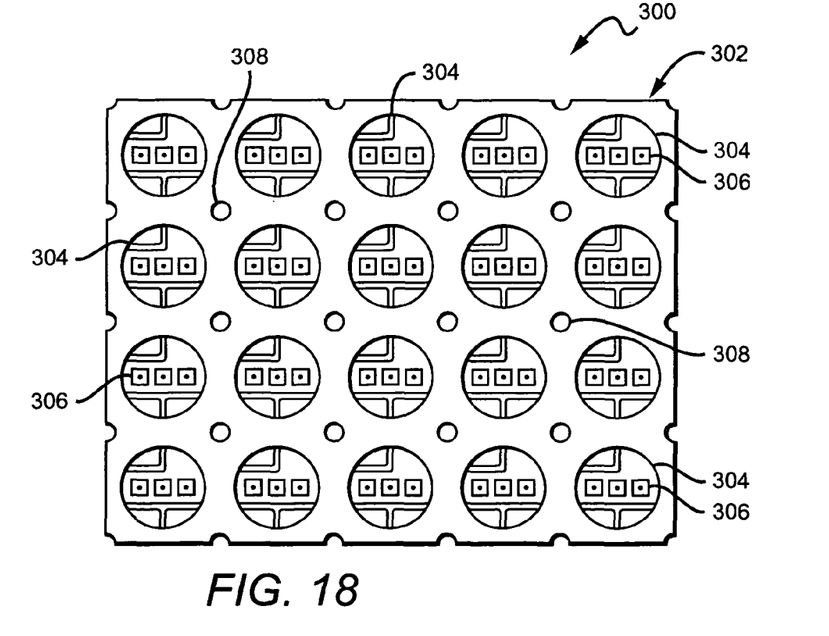
FIG. 18 is a front elevation view of a portion of an LED display screen incorporating surface mount devices in accordance with embodiments of the present invention.

With reference to FIG. 18, there is shown in schematic form a portion of an LED display screen 300, for example, an indoor screen comprising, in general terms, a driver PCB 302 carrying a large number of surface-mount devices 304 arranged in rows and columns, each SMD defining a pixel. The SMDs 304 may comprise devices such as the embodiments shown in FIGS. 1-8, 9-11, and 12-17. The SMD devices 304 are electrically connected to traces or pads on the PCB 302 connected to respond to appropriate electrical signal processing and driver circuitry (not shown).

As disclosed above, each of the SMDs carries a vertically oriented, linear array 306 of red, green and blue LEDs. Such a linear orientation of the LEDs has been found to improve color fidelity over a wide range of viewing angles. Through-holes 308 may also be provided to allow for better and shorter contact for the ceramic SMD body to the PCB. Through-holes 308 also allow for improved thermal dissipation.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

We claim:

1. A lead frame for a surface-mount device, said lead frame comprising:
    an electrically conductive LED chip carrier part having a surface carrying a linear array of LEDs adapted to be energized to produce in combination a substantially full range of colors, each LED having a first electrical terminal and a second electrical terminal, the first terminal of each of the LEDs being electrically and thermally coupled to said chip carrying surface of said chip carrier part;
    electrically conductive connection parts separate from said chip carrier part, each of said connection parts having a connection pad;
    the second terminal of each of said LEDs being electrically coupled to the connection pad of a corresponding one of said connection parts; and
    a black casing at least partially encasing said lead frame.

2. The lead frame of claim 1, wherein the first and second electrical terminals of each of said LEDs comprise a cathode and an anode, respectively.

3. The lead frame of claim 1, wherein the linear array of LEDs extends in a first direction and each of said chip carrier parts and said connection parts has a lead, said leads being disposed in parallel relationship with each other and extending in a second direction orthogonal to said first direction.

4. The lead frame of claim 1, wherein the chip carrier part and the connection parts are made of sheet metal.

5. The lead frame of claim 1, wherein said chip carrier part has a lead electrically coupled to said chip carrying surface, said lead having a thickness, and said chip carrying surface of the chip carrier part comprises a surface of a thermally conductive body extending in a direction normal to said chip carrying surface, said thermally conductive body having a thickness greater than the thickness of said chip carrier part lead.

6. The lead frame of claim 1, wherein the LEDs comprise a red, a green, and a blue LED.

7. The lead frame of claim 1, wherein the second electrical terminal of each of said LEDs is electrically coupled to the connection pad of the associated connection part by means of a single wire bond.

8. The lead frame of claim 1, wherein said casing comprises black ceramic.

9. The lead frame of claim 1, wherein said chip carrier part comprises a corresponding thermally conductive body extending in a direction normal to said surface.

10. A surface-mount device, comprising:
    a dark casing comprising opposed first and second main surfaces, opposed side surfaces, and opposed end surfaces, the casing defining a cavity extending into the interior of the casing from the first main surface; and
    a lead frame at least partially encased by said casing, the lead frame comprising:
        an electrically conductive LED chip carrier part having a surface carrying a linear array of LEDs adapted to be energized to produce in combination a substantially full range of colors, each LED having a first electrical terminal and a second electrical terminal, the first terminal of each of the LEDs being electrically and thermally coupled to said chip carrying surface of said chip carrier part;
        electrically conductive connection parts separate from said chip carrier part, each of said connection parts having a connection pad; and
        the second terminal of each of said LEDs being electrically coupled to the connection pad of a corresponding one of said connection parts.

11. The device of claim 10, wherein the first and second electrical terminals of each of said LEDs comprise a cathode and an anode, respectively.

12. The device of claim 10, wherein the linear array of LEDs extends in a first direction and each of said chip carrier parts and said connection parts has a lead, said leads being disposed in parallel relationship with each other and extending through the end surfaces of the casing in a second direction orthogonal to said first direction.

13. The device of claim 10, wherein the chip carrier part and the connection parts are made of sheet metal.

14. The device of claim 10, wherein the chip carrying surface of the chip carrier part comprises a surface of a thermally conductive body extending in a direction normal to said chip carrying surface to a bottom surface of the body exposed through an aperture formed in the second main surface of the casing.

15. The device of claim 10, wherein the LEDs comprise a red, a green, and a blue LED.

16. The device of claim 10, wherein the second electrical terminal of each of said LEDs is electrically coupled to the connection pad of the associated connection part by means of a single wire bond.

17. The device of claim 10, wherein said casing is comprised of black ceramic.

18. The device of claim 10, wherein said chip carrier part comprises a corresponding thermally conductive body extending in a direction normal to said surface.

19. An LED display comprising:
    a substrate carrying an array of surface-mount devices arranged in vertical columns and horizontal rows, each of said SMDs comprising a dark casing and containing a vertically oriented, linear arrangement of LEDs adapted to be energized to produce in combination a substantially full range of colors and to define one pixel of the display; and
    signal processing and LED drive circuitry electrically connected to selectively energize said array of SMDs for producing visual images on said display.

20. The display of claim 19, wherein said casing of each SMD is comprised of black ceramic.

21. The display of claim 19, wherein each of said SMDs is coupled with the substrate via solder pads at the bottom surface of each SMD.

22. The display of claim 19, wherein said casing of each SMD comprises rounded edges such that through-holes are created when the SMDs are arranged on said substrate, said through-holes aiding in thermal management.

23. The display of claim 19, wherein each of said SMD comprises a corresponding electrically conductive LED chip carrier part having a surface carrying the linear arrangement of LEDs.

24. The display of claim 23, wherein each corresponding carrier part comprises a corresponding thermally conductive body extending in a direction normal to said surface.

* * * * *